United States Patent [19]

Ireland et al.

[11] Patent Number: 5,750,012

[45] Date of Patent: May 12, 1998

[54] MULTIPLE SPECIES SPUTTERING FOR IMPROVED BOTTOM COVERAGE AND IMPROVED SPUTTER RATE

[75] Inventors: P. J. Ireland, Nampa; Howard Rhodes, Boise; Sujit Sharan, Boise; Sukesh Sandhu, Boise; Tim O'Brien, Boise; Tim Johnson, Eagle, all of Id.

[73] Assignee: Micron Technology, Inc., Boise, Id.

[21] Appl. No.: 627,262

[22] Filed: Apr. 4, 1996

[51] Int. Cl.$^6$ .................................................. C23C 14/34
[52] U.S. Cl. .......................... 204/192.12; 204/192.15; 204/192.17; 204/192.25; 204/192.1
[58] Field of Search ......................... 204/192.1, 192.12, 204/192.15, 192.17, 192.25

[56] References Cited

U.S. PATENT DOCUMENTS

| 5,114,556 | 5/1992 | Lamont, Jr. | 204/192.12 |
| 5,320,984 | 6/1994 | Zhang et al. | 204/192.25 |
| 5,330,628 | 7/1994 | Demaray et al. | 204/192.12 |

OTHER PUBLICATIONS

"Quantitative Sputterin", P.C. Zalm, Philips Research Laboratories, The Netherlands, Surface and interface Analysis, vol. 11, pp. 1–24, 1988.

"Comparison of Magnetron Sputter Deposition Conditions in Neon, Argon, Krypton and Xenon Discharges," I. Petrov, I. Ivanov, and V. Orlinov, Institute of Electr., Bulgaria, J.E. Sundgren, thin Film Div. Dept. of Physics, Linkoping, Sweden, J. vac. Sci. Tech. Oct. 1993.

"Sputter Erosion Amplification," S. Berg, A.M. Barklund, C. Nender, I.V. Katardjiev, and H. Barankova, Electr. Dept., Inst. of Tech., Uppsala, Sweden, Surface and Coatings Technology, 54/55, pp. 131–135, 1992.

"Angular Distribution of Sputtered Atoms from Polycrystalline Metal Targets," H. Tsuge and S. Esho, *Basic Technology Research Laboratories*, Japan, J. Appl. Phys. 52(7), Jul. 1981, pp. 4391–4395.

"Sustained Self–Sputtering Using Direct Current Magnetron Source," Witold M. Posadowski, *Institute of Electron Technology, Poland*, and Zbigniew J. Radzimski, *Research Center for Integrated Systems, Japan*, J. Vac. Sci. Technol., pp. 2980–2984.

"Directionality of Sputtered Cu Atoms in a Hollow Cathode Enhanced Planar Magnetron," G.M. Turner, S.M. Rossnagel, and J.J. Cyinim, *IBM Thomas J. Watson Research Center, New York 10598*, J. Vac. Sci. Technol. A 11(5), Sep./Oct. 1993.

"Energetic Particle Bombardment of Films During Magnetron Sputtering," S. M. Rossnagel, *IBM T.J. Watson Research Center, New York*, 10598, J. Vac. Sci. Technol. A 7(3), May/Jun. 1989, pp. 1025–1029.

(List continued on next page.)

*Primary Examiner*—R. Bruce Breneman
*Assistant Examiner*—Rodney G. McDonald
*Attorney, Agent, or Firm*—Workman, Nydegger & Seeley

[57] ABSTRACT

An improved sputtering process increases the perpendicularity of the sputtered flux to the target surface by bombarding the target with both low and high mass ions, with low mass ions predominating, packing the target with both low and high mass implanted ions, and causing target atoms ejected as a result of high mass incident ions to have a higher probability of perpendicular or near perpendicular ejection. An alternative improved sputtering process bombards the target with both low and high mass ions, with high mass ions predominating, resulting in a higher sputter rate than achievable with either the high or low mass species alone. Including in either process as the high or the low mass species a species having a lower ionization energy than a standard species allows a reduced pressure plasma, resulting in less scattering of the sputtered flux. A low ionization energy species may also be employed to assist in striking a plasma before sputtering by a single species during deposition.

37 Claims, 4 Drawing Sheets

OTHER PUBLICATIONS

"Spatial and Angular Nonuniformities from Collimated Sputtering," S. K. Dew, D. Liu, and M. J. Brett, *Dedpt. of Electrical Eng., Univ. of Alberta, Canada*, and T. Smy, *Dept. of Electr., Carleton Univ., Canada*, J. Vac. Sci. Technol. B 11(4), Jul./Aug. 1993, pp. 1281–1285.

"Self–Sputtering with DC Magnetron Source: Target Material Consideration," Z. J. Radzimski, *No. Carolina State Univ., NC*, W. M. Posadowski, *Technical Univ. of Wroclaw, Poland*, Society of Vacuum Coaters, 37th Annual Technical Conf. Proceedings (1994), pp. 389–394.

"Sputtering in a Glow Discharge Ion Source—Pressure Dependence: Theory and Experiment," Rod S. Mason and Melanie Pichilingi, *Dept. of Chemistry, Univ. of Wales, UK*, J. Phys. D: Appl. Phys. 27 (1994), pp. 2363–2371.

"An Attempt to Understand the Sputtering Yield Enhancement Due to Implantation of Inert Gases in Amorphous Solids," K. Wittmaack, *Gesellschaft für Strahlen, Fed. Rep. Germany*, Nuclear Instruments and Methods in Physics Research B2 (1984) pp. 569–572.

"Comparison of Magnetron Sputter Deposition Conditions in Neon, Argon, Krypton, and Xenon Discharges," I. Petrov, I. Ivanov, and V. Orlinov, *Institute of Electr., Bulgaria*, J. E. Sundgren, *Thin Film Div., Dept. of Physics, Linköping, Sweden*, J. Vac. Scie. Technol. A, vol. 11, No. 5, Sep./Oct. 1993.

"Angular Distribution of Particles Sputtered from Metals and Alloys," A. Wucher and W. Reuter, *IBM T.J. Watson Research Center, New York*, J. Vac. Sci. Technol. A 6(4), Jul./Aug. 1988.

"Computer Simulation of Low–Energy Sputtering in the Binary Collision Approximation," M. Hou, *Universite Libre de Bruxelles, Belgium*, and M. T. Robinson, *Oak Ridge National Lab., TE*, Appl. Phys. 18.381–389 (1979).

"Angular Dependence of Secondary Ion Emission from Silicon Bombarded with Inert Gas Ions," K. Wittmack, *Gesellschaft für Strahlen, Fed. Rep. Germany*, Elsevier Science Publishers B.V., No. Holland Physics Publishing Div., pp. 674–678.

"Sputter Deposition of Platinum Films in Argon/Oxygen and Neon/Oxygen Discharges," C. R. Aita, *Materials Dept. and Lab. for Surface Studies, Univ. of Wisconsin–Milwaukee, Wis.*, and Ngoc C. Tran, *Materials Science Center, Univ. of Wisconsin–Madison, Wis.*, J. Appl. Phys. 56(4), 15 Aug. 1984, pp. 958–963.

"A Monte Carlo Simulation of Angular Distribution in Low Energy Sputtering," Zheng Li–Ping, *Inst. of Nuclear Res. and Ion Beam Lab, Shanghai PRC*, Cui Fu–Zhai, *Dept. of Eng. Physics, Tsinghusa Univ., Beijing, PRC*, Vacuum, vol. 39, Nos. 2–4, pp. 353–354 (1989).

"Sputter Erosion Amplification," S. Gerg, A.M. Barklund, C. Nender, I.V. Katardjiev, and H. Barankova, *Electr. Dept. Inst. of Tech, Uppsala, Sweden*, Surface and Coatings Technology, 54/55 (1992), pp. 131–135.

"Synergistic Sputtering Effecs During Ion Bombardment with Two Ion Species," S. Berg and I. V. Katardjiev, *Inst. of Technology, Uppsala Univ., Sweden*, J. Vac. Sci. Technol., May/Jun. 1995, pp. 831–833.

"Atom Assisted Sputtering Yield Amplification," S. Berg, A. M. Barklund, B. Gelin, C. Nender, and I. Katardjiev, *Inst. of Technology, Uppsala University, Sweden*, J. Vac. Sci. Technol. A 10(4), Jul./Aug. 1992, pp. 1592–1596.

MULTIPLE SPECIES SPUTTERING FOR IMPROVED BOTTOM COVERAGE AND IMPROVED SPUTTER RATE

BACKGROUND OF THE INVENTION

1. The Field of the Invention

The present invention relates to sputtering methods in the manufacture of semiconductor devices. More particularly, the present invention is directed to novel processes for sputtering with multiple ion species for improved bottom coverage and improved sputter rate in the manufacture of semiconductor devices.

2. The Relevant Technology

Various types of sputtering processes, including RF and DC sputtering, magnetron assisted sputtering, triode sputtering, ion beam sputtering, and others, have found wide application in the manufacture of semiconductor devices for deposition and for other applications.

Sputter deposition is one of the most economical alternatives for depositing many types of films. With particles of sputtered material approaching a substrate at various angles of incidence, sputtering can provide films having excellent uniformity.

As integrated circuits have become increasingly dense, however, the multidirectional flux of deposition material typically produced by sputtering has become a disadvantage for certain processes.

Contact and via plugs and other structures of highly dense integrated circuits may have aspect ratios as high as 5:1 or more. Such structures are generally formed by filling a trench or hole previously defined in an underlying layer or layers with materials deposited by sputtering or CVD processes. The multi-directional flux of typical sputtering processes can cause the trench or hole to be closed off at the top thereof without adequate filling of the bottom thereof, resulting in a "keyhole."

This problem is illustrated in FIG. 1. FIG. 1 is a partial cross-section of a partially formed integrated circuit device. A hole 16 has been previously formed in an underlying layer 12. A layer 14 of a deposited material is being sputter deposited over layer 12. Sputtered atoms of the deposited material approach layer 12 at various angles of incidence, including for example along the directions indicated by arrows A, B, C. Sputtered atoms approaching layer 12 in the direction of arrow B result in a buildup 18 of layer 14 on the right side of hole 16. Sputtered atoms approaching layer 12 in the direction of arrow C result in a buildup 20 of layer 14 on the left side of hole 16. Buildup 18 and buildup 20 eventually approach one another, closing off hole 16 and leaving a keyhole-shaped portion of hole 16 unfilled.

FIG. 2 schematically represents the standard solution to the problem of insuring adequate bottom coverage of high-aspect ratio features such as hole 16 illustrated in FIG. 1. A target 22 of a material to be sputtered is placed some distance from a substrate 26. A plasma 24 is formed, and ions from plasma 24 are accelerated toward target 22, sputtering target 22, producing a multi-directional flux of sputtered atoms of the material of target 22. A collimator 28 is placed between target 22 and substrate 26. Collimator 28 functions as a screen or filter, preventing sputtered atoms of target material approaching substrate 26 at large angles of incidence from reaching substrate 26. Such sputtered atoms are deposited on collimator 28 instead.

Sputtering with a collimator as illustrated in FIG. 2 has certain drawbacks. Deposits of the target material build up on the collimator, requiring frequent cleaning with associated downtime. The collimator reduces the deposition rate at substrate 26, requiring longer processing time for a given deposition thickness. The collimator also can exacerbate non-uniformities in the sputtering process, resulting in wider thickness variations within the deposited film. Decreasing the aspect ratio of the collimator reduces these problems, but reduces the collimator's effectiveness. Hence an improved method of sputter deposition for high-aspect ratio layers is needed.

SUMMARY AND OBJECTS OF THE INVENTION

An object of the present invention is to provide a method of sputter deposition for high-aspect ratio layers providing improved bottom coverage.

A further object of the present invention is to provide a method of sputter deposition for high-aspect ratio layers providing increased deposition rates.

A still further object of the present invention is to provide a method of sputter deposition for high-aspect ratio layers allowing decreased collimator aspect ratio.

Another object of the present invention is to provide a method of sputter deposition for high-aspect ratio layers allowing deposition without a collimator.

A further object of the present invention is to provide a method of sputter deposition having increased time between required collimator cleanings.

A still further object of the present invention is to provide a method of sputter deposition employing two or more ionized species to achieve any of the forgoing objectives.

In accordance with the present invention, the perpendicularity of a flux of sputtered atoms to a substrate surface is increased by bombarding a target with both a low and a high mass ion species.

Where the low mass ion species is the typical sputtering species for a given target, the low mass species preferably predominates. The high mass ions pack the target nearer to the target surface than the typical packing by the low mass ions, causing target atoms ejected by the impact of low mass incident ions to have a higher probability of ejection in a direction perpendicular or nearly perpendicular to the target surface.

Where the high mass ion species is the typical sputtering species for a given target, the high mass species preferably predominates. The low mass ions pack the target at a deeper depth than the typical packing by the high mass species, resulting in a higher sputter rate than achievable with either the high or low mass species alone. As an alternative, three or more ion species may be employed, with high, medium and low mass species included. The medium mass species packs the target at a certain depth, while the low mass species packs the target at a deeper depth and the high mass species packs the target at a shallower depth, resulting in increased target packing with increased sputter rate and increased perpendicularity of the sputtered flux.

In the above processes, a sputtering species having a lower ionization energy than a sputtering species with which it is employed allows a reduced pressure plasma as compared to a plasma composed solely of the sputtering species with which it is employed, resulting in less scattering of the sputtered flux, thereby improving the directionality of sputtered target atoms reaching the substrate. A low ionization energy species may also be employed to assist in striking a the plasma, but then may be removed from the plasma before deposition.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

In one preferred method of the present invention, multiple sputtering species are employed to produce a flux of sputtered atoms having greater perpendicularity to the target than is achievable with a single-species sputtering process. The precise mechanisms responsible for the improved perpendicularity of the sputtered atoms have not been fully ascertained, and the present invention is not limited to a particular mechanism. The particular process of the invention, including possible mechanisms by which the improvements are believed to be achieved, is nonetheless illustrated below with reference to FIG. 3.

Figure 1:
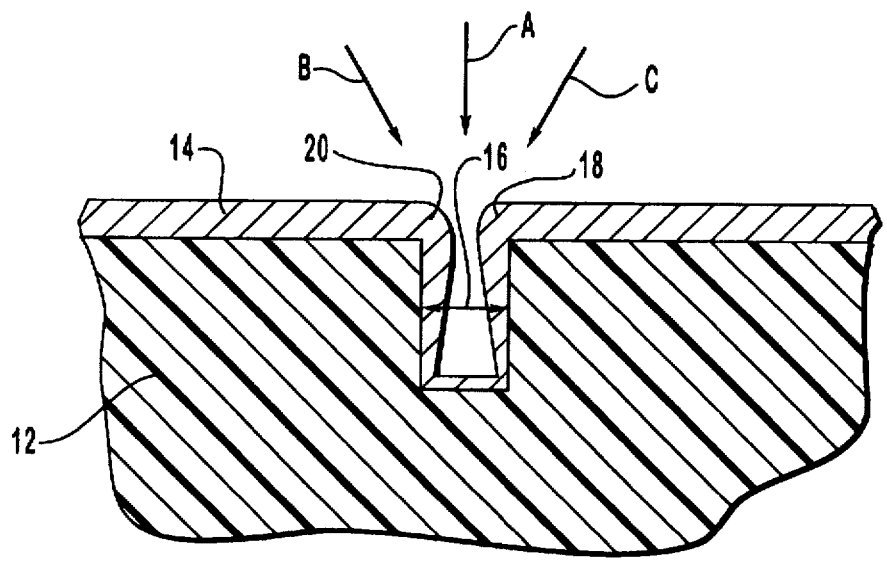
FIG. 1 is a partial cross section of a partially-formed integrated circuit.
Figure 2:
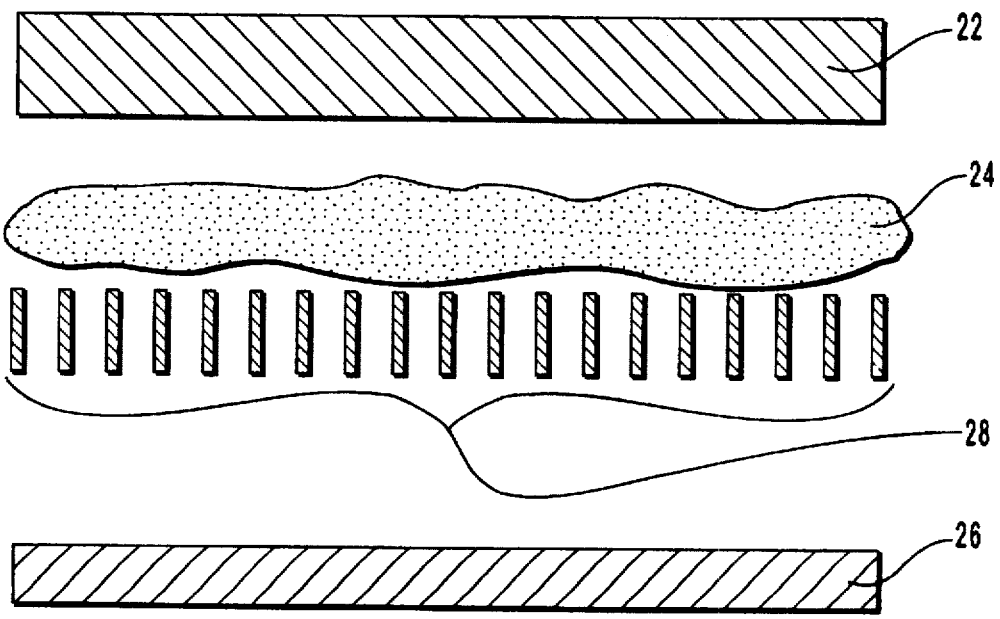
FIG. 2 is a schematic representation of a collimated sputtering device.
Figure 3:
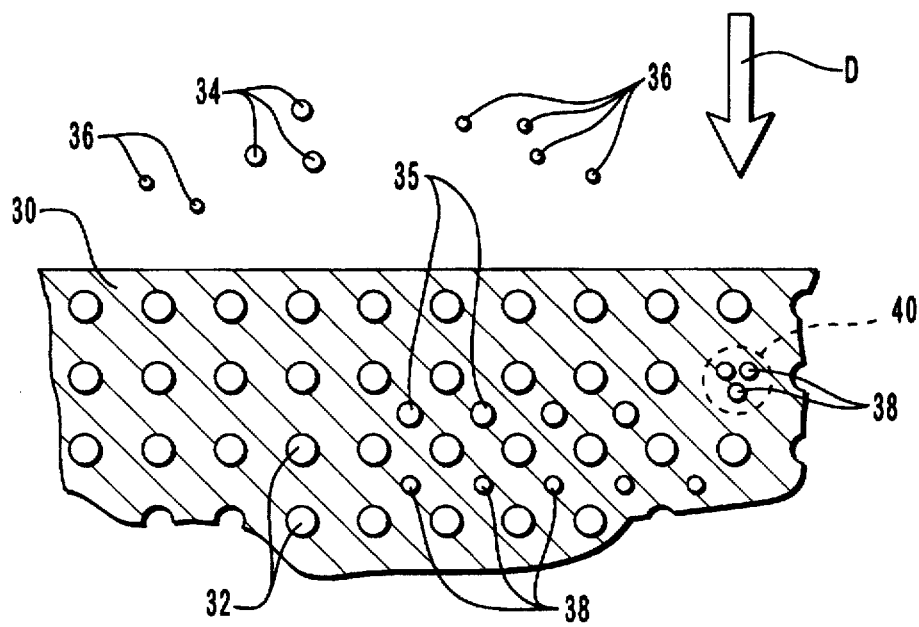
FIG. 3 is a schematic representation of a sputtering target being sputtered according to a method of the present invention.

FIG. 3 shows a target 30 of a material to be deposited. Target 30 is comprised of target atoms 32. Target 30 is bombarded with two species of ions, large mass ions 34 and small mass ions 36, approaching target 30 in a range of directions represented by a direction D. Large mass ions 34 tend to sputter target atoms 32 from target 30. Small mass ions 36 tend to implant in target 30 near the surface thereof, resulting in implanted small mass ions 38, packing the spaces between target atoms 32 and filling voids such as void 40 left by the sputtering process. Large mass ions 34 also pack target 30, but at a depth even closer to the surface of target 30, resulting in implanted large mass ions 35. The packing and filling of target 30 by implanted small mass ions 38 and implanted large mass ions 35 constrains the possible directions of movement of target atoms 32 near the surface of target 30, increasing the likelihood that sputtered target atoms will leave target 30 in a direction perpendicular or near perpendicular to the target surface.

The flux of target atoms resulting from the above method is more perpendicular to the target surface than could be achieved by sputtering with either the large mass ions or the small mass ions alone. Also, where one of the ion species has a lower ionization potential, the plasma can be maintained at a lower pressure than if the other ion species were used alone. This provides a greater mean free path for the sputtered atoms, better preserving the perpendicularity of the flux by avoiding scattering.

In a currently preferred application of the above method, the target material is titanium, the large mass ions are xenon and the small mass atoms are argon or neon. Xenon has an ionization energy of 12.130 eV compared to 15.759 eV for argon, a typical sputtering ion.

While the methods of the present invention may be beneficially applied to sputtering titanium, the target may be formed of any desired material, including compound or composite targets. The target may also be crystalline, polycrystalline, or amorphous, although the directionality of the sputtered flux may be enhanced by a properly oriented crystalline target. Multiple targets of the same or differing materials may also be sputtered simultaneously.

The two ionized species may similarly be any noble gasses, any elements nonreactive in the sputtering environment, or even reactive elements if reactive sputtering is desired. For example, at least one of the two ionized species can be unreactive with any of the target, the substrate, and the other of said first and second species. Alternatively, by way of example, at least one of the two ionized species can be reactive with any of the target, the substrate, and with the other of the two ionized species.

For the greatest increase in perpendicularity of sputtered atoms, the preferred ratio of small mass to large mass ions impacting the target is at least 1:1, with about 7:3 most preferred.

The currently preferred sputtering technique for use in the above method is planar magnetron sputtering, but the above method is applicable to other sputtering techniques known in the art including ion beam sputtering, diode sputtering (direct current diode and radio frequency diode) and triode sputtering.

The increased perpendicularity of the sputtered flux provided by the above method results in improved bottom coverage of high aspect ratio features. The increased perpendicularity of the sputtered flux provided by the above method also can potentially allow sputter deposition of high aspect ratio layers without the use of a collimator, eliminating a substantial source of contamination from the sputtering system. Alternatively, the aspect ratio of a collimator used in conjunction with the above method may be reduced, resulting in more uniform deposition coverage and less frequent collimator cleaning. Even with a standard collimator, the above process provides less frequent collimator cleaning, since the fraction of target material flux which must be caught by the collimator is decreased.

In another preferred method of the present invention, the target contains at least two or more materials to be sputtered. By way of example and illustration, target atoms 32 in FIG. 3 may include two or more types of atoms or may instead be target molecules.

Figure 4:
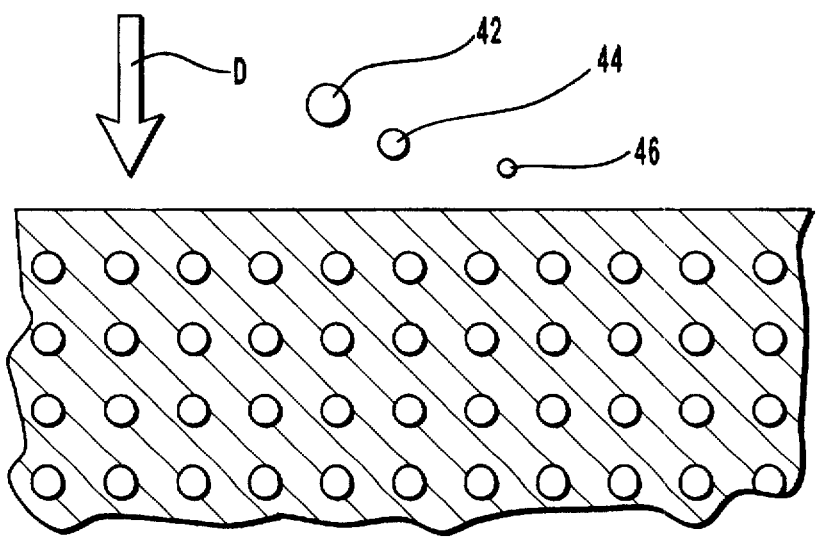
FIG. 4 is a schematic representation of a sputtering target being sputtered according to a method of the present invention.

In yet another preferred method of the present invention, more than two sputtering species are employed to produce a greater total flux of sputtered atoms than is achievable with a single-species sputtering process. According to this preferred method, an example of which is seen in FIG. 4, a high mass species 42, a medium mass species 44, and a low mass species 46 are employed in the sputtering process. The precise mechanisms responsible for the increased sputter rate of the sputtered atoms have not been fully ascertained, and the present invention is not limited to a particular mechanism. The particular process of the invention, including possible mechanisms by which the improvements are believed to be achieved, is nonetheless illustrated below with reference to FIGS. 5A, 5B, and 6.

Figure 5A:
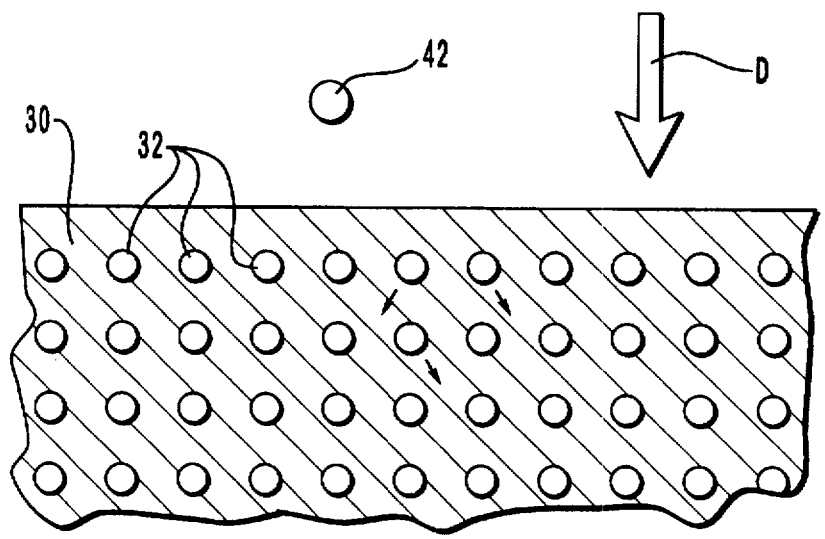
FIG. 5A is a schematic representation of a sputtering target being sputtered according to a method of the present invention.
Figure 5B:
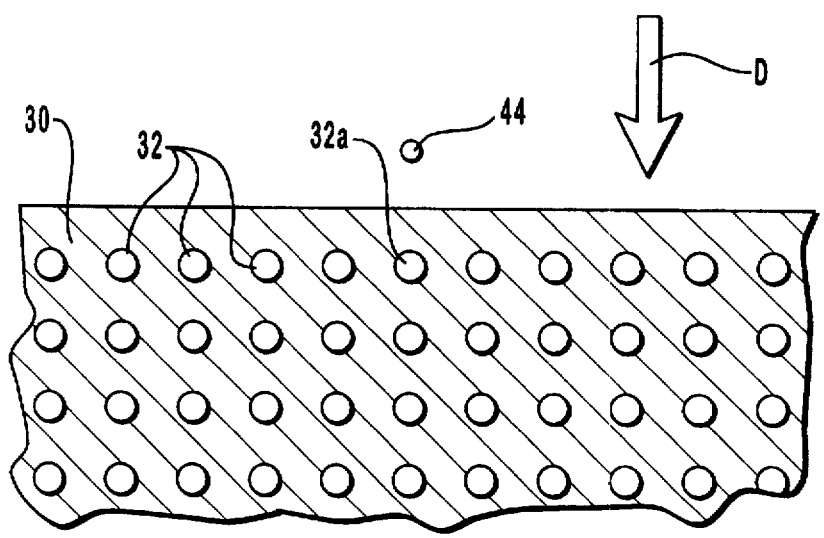
FIG. 5B is a schematic representation of the sputtering target of FIG. 5A being sputtered according to a method of the present invention.

In FIG. 5A, large mass ion 42 approaches target 30, comprised of target atoms 32, along a range of directions represented by a direction D. On impact with target 30, large mass ion 42 causes dislocations of target atoms 32, for example, in the directions indicated. The resulting damage to the structure of target 30 weakens the bonds between certain of target atoms 32 such as target atom 32a in FIG. 5B. When target atom 32a is subsequently impacted by medium mass ion 44 approaching along direction D as depicted in FIG. 5B, target atom 32a will have a higher probability of being sputtered than if no impact by large mass ion 42 had occurred. With the ratio of large mass to medium mass ions approaching target 30 preferably at least 1:1, the sputtering rate at which target 30 is sputtered can be greater than either sputtering with the large mass ions alone or sputtering with the medium mass ions alone.

Figure 6:
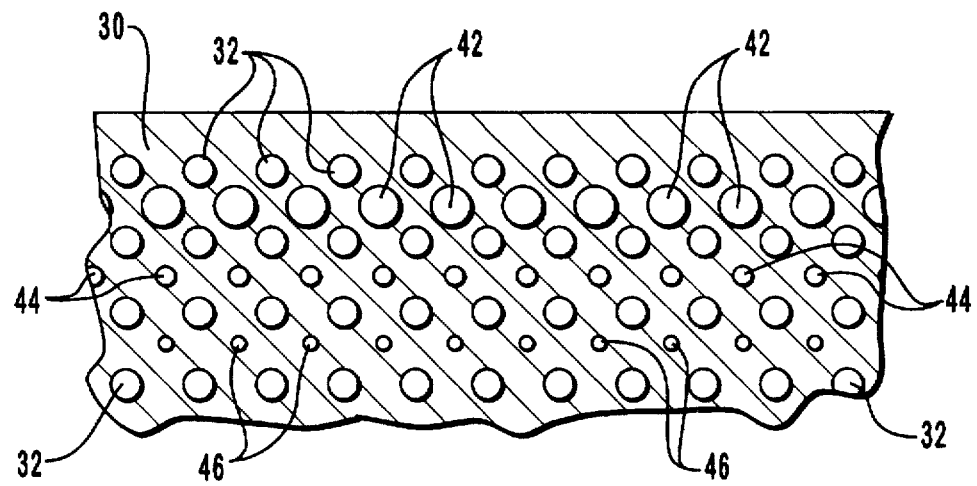
FIG. 6 is a schematic representation of a sputtering target showing target packing resulting from a method of the present invention.

Sputtering with more than two ion species can also increase packing of the target, such as illustrated in FIG. 6. As shown in FIG. 6, small mass ions 46 tend to pack target 30 at a depth deeper than medium mass ions 44, while large mass ions 42 pack the target at a shallower depth than medium mass ions 44. The result is a greater degree of target packing with a consequently increased likelihood that ejected target material will be ejected perpendicularly to the target surface.

The currently preferred materials for the above method are neon, argon, and xenon for sputtering a titanium target. Since xenon has a lower ionization energy than argon, the plasma can be maintained at a lower pressure than if argon were used alone. This provides a greater mean free path for the sputtered atoms, increasing the perpendicularity of the flux at the substrate by avoiding scattering.

Figure 7:
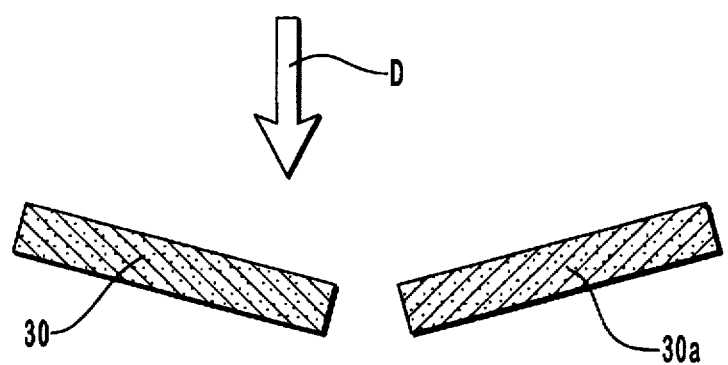
FIG. 7 is a schematic representation of sputtering targets used in methods of the present invention.

In yet another preferred embodiment of the invention, which by example is illustrated in FIG. 7, two or more targets such as target 30 and target 30a are employed in the sputtering process to deposit two or more target materials upon a substrate.

Multiple ionized species can also be beneficially employed before the start of sputtering or before the start of deposition. If only a single ionized species is desired during deposition for some reason, improved perpendicularity through reduced scattering may be achieved by striking a plasma with an additional species present, the additional species having a lower ionization potential than the species used for deposition, then removing the additional species from the plasma before the start of deposition. This technique can reduce the time needed to achieve a stable, low pressure plasma, since the plasma may be struck or produced at, or at least closer to, the operating pressure. Hydrogen is particularly useful as an additional species, having a relatively low ionization energy of 13.598, and being easily removed from the process chamber, though pre-sputtering may be required to remove hydrogen reaction products if a target that is reactive with hydrogen is employed. Xenon and other elements may also be used.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for depositing a fill material by sputtering comprising: providing a target comprising at least one material to be sputtered, and a substrate; producing a plasma, said plasma comprising an ionized first species having a first molecular weight, an ionized second species having a second molecular weight greater than said first molecular weight, and an ionized third species; sustaining the production of the plasma before the start of substantial deposition while removing said third species from said plasma; sputtering said target in said plasma with said first and second ionized species to create a flux of sputtered atoms of said at least one material ejected from a surface of said target; and exposing said substrate to said flux, wherein the proportion of ions of said first species to ions of said second species approaching said target is greater than one to one, whereby the perpendicularity of said flux ejected from the surface of said target is increased over that achieved by sputtering in a plasma of one of said first and second species.

2. The method as defined in claim 1 wherein said producing a plasma includes diode sputtering.

3. The method as defined in claim 1 wherein said producing a plasma includes magnetron sputtering.

4. The method as defined in claim 1 wherein said target comprises at least two materials, and said at least two materials are deposited upon said substrate.

5. The method as defined in claim 1 further comprising:
providing a second target comprising at least one additional material to be sputtered; and
sputtering said second target in said plasma, creating a flux of sputtered atoms of said additional material, whereby said additional material is deposited upon said substrate.

6. The method as defined in claim 1, further comprising providing a collimator between said target and said substrate.

7. The method as defined in claim 1, wherein said at least one material of said target comprises titanium.

8. The method as defined in claim 1, wherein one of said first and second species has a lower ionization potential than the other of said first and second species, whereby said plasma may be provided at a pressure lower than a plasma comprising only said other of said first and second species.

9. The method as defined in claim 1, wherein at least one of said first and second species is unreactive with any of the target, the substrate, and the other of said first and second species.

10. The method as defined in claim 1, wherein at least one of said first and second species is reactive with the target, the substrate, and the other of said first and second species.

11. The method as defined in claim 1, wherein one of said first and second species comprises a noble gas.

12. The method as defined in claim 11, wherein both said first and second species comprises a noble gas.

13. The method as defined in claim 12, wherein said first species comprises argon and said second species comprises xenon.

14. The method as defined in claim 12, wherein said first species comprises neon and said second species comprises argon.

15. The method as defined in claim 12, wherein said first species comprises neon and said second species comprises xenon.

16. The method as defined in claim 1, wherein the proportion of ions of said first species to ions of said second species in said plasma is about 7:3.

17. The method as defined in claim 1, wherein said producing a plasma further comprises producing said plasma with an ionized fourth species, and said sputtering further comprises sputtering said target in said plasma with said first, second, and fourth ionized species to create a flux of sputtered atoms of said material ejected from a surface of said target.

18. A method for depositing a fill material by sputtering comprising: providing a target comprising at least one material to be sputtered, and a substrate; producing a plasma, said plasma comprising an ionized first species having a first molecular weight, an ionized second species having a second molecular weight greater than said first molecular weight, and an ionized third species; sustaining the production of the plasma before the start of substantial deposition while removing said third species from said plasma; sputtering said target in said plasma with said first and second ionized species to create a flux of sputtered atoms of said at least one material ejected from a surface of said target; and exposing said substrate to said flux, wherein the proportion of ions of said second species to ions of said first species approaching said target is greater than one to one, whereby the perpendicularity of said flux ejected from the surface of said target is increased over that achieved by sputtering in a plasma of one of said first and second species.

19. The method as defined in claim 18 wherein said producing a plasma includes diode sputtering.

20. The method as defined in claim 18 wherein said producing a plasma further comprises producing said plasma with an ionized fourth species, and said sputtering further comprises sputtering said target in said plasma with said first, second, and fourth ionized species to create a flux of sputtered atoms of said at least one material ejected from a surface of said target.

21. The method as defined in claim 18 wherein said producing a plasma includes magnetron sputtering.

22. The method as defined in claim 18 wherein said at least one material of said target comprises at least two materials, whereby said at least two materials are deposited upon said substrate.

23. The method as defined in claim 18 further comprising:
providing a second target comprising at least one additional material to be sputtered; and
sputtering said second target in said plasma with said first and second ionized species to create a flux of sputtered atoms of said additional material ejected from a surface of said second target, whereby said additional material of said second target is deposited upon said substrate.

24. The method as defined in claim 18, further comprising providing a collimator between said target and said substrate.

25. The method as defined in claim 18, wherein said at least one material of said target comprises titanium.

26. The method as defined in claim 18, wherein one of said first and second species has a lower ionization potential than the other of said first and second species, whereby said plasma may be provided at a pressure lower than a plasma of one of said first and second species.

27. The method as defined in claim 18, wherein at least one of said first and second species is unreactive with any of the target, the substrate, and the other of said first and second species.

28. The method as defined in claim 18, wherein at least one of said first and second species is reactive with the target, the substrate, and with the other of said first and second species.

29. The method as defined in claim 18, wherein one of said first and second species comprises a noble gas.

30. The method as defined in claim 29, wherein said first species comprises a noble gas and said second species comprises a noble gas.

31. The method as defined in claim 30, wherein said first species comprises argon and said second species comprises xenon.

32. The method as defined in claim 30, wherein said first species comprises neon and said second species comprises argon.

33. The method as defined in claim 30, wherein said first species comprises neon and said second species comprises xenon.

34. A method for depositing a fill material by sputtering comprising: providing a target comprising at least one material to be sputtered, and a substrate; producing a plasma initially comprised of at least a first species of ions and a second species of ions; sustaining the production of the plasma before the start of substantial deposition while removing said first species from said plasma; sputtering said target in said plasma with said second ionized species to create flux of sputtered atoms of said at least one material ejected from a surface of said target; and exposing said substrate to said flux, wherein said first species has a lower ionization potential than said second species, and whereby the plasma may be produced at a lower pressure than that at which a plasma of one of the second species alone may be produced.

35. The method as defined in claim 34 wherein said second species comprises argon and said first species comprises xenon.

36. The method as defined in claim 34 wherein said second species comprises argon and said first species comprises hydrogen.

37. The method as defined in claim 34, wherein said sustaining the production of the plasma comprises reducing the pressure of said plasma to below the pressure at which a plasma of the second species alone be produced, whereby the mean free path of said flux from the target to the substrate is increased above that of a plasma of the second species alone.

* * * * *

UNITED STATES PATENT AND TRADEMARK OFFICE
CERTIFICATE OF CORRECTION

PATENT NO. : 5,750,012
DATED : May 12, 1998
INVENTOR(S) : P. J. Ireland; Howard Rhodes; Sujit Sharan; Sukesh Sandhu; Tim O'Brien; Tim Johnson It is certified that error appears in the above-identified patent and that said Letters Patent is hereby corrected as shown below:

Cover Page, Other Publications, line 1, after "Quantitative" change "Sputterin" to --Sputtering--

Cover Page, Other Publications, line 2, after "and" change "interface" to -- Interface--

Cover Page, Other Publications, line 7, after "Sundgren," change "thin" to --Thin--

Col. 2, line 32, after "the" change "forgoing" to --foregoing--

Col. 2, line 66, before "plasma" delete --the-- (first occ.).

Signed and Sealed this

Twenty-third Day of February, 1999

Attest:

Q. TODD DICKINSON

*Attesting Officer*  *Acting Commissioner of Patents and Trademarks*